United States Patent
Lin

(10) Patent No.: US 9,812,414 B1
(45) Date of Patent: Nov. 7, 2017

(54) CHIP PACKAGE AND A MANUFACTURING METHOD THEREOF

(71) Applicant: NANYA TECHNOLOGY CORPORATION, Taoyuan (TW)

(72) Inventor: Po Chun Lin, Changhua (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 15/186,100

(22) Filed: Jun. 17, 2016

(51) Int. Cl.
*H01L 23/48* (2006.01)
*H01L 23/00* (2006.01)
*H01L 23/538* (2006.01)

(52) U.S. Cl.
CPC .......... *H01L 24/02* (2013.01); *H01L 23/5389* (2013.01); *H01L 24/13* (2013.01); *H01L 2224/0219* (2013.01); *H01L 2224/02165* (2013.01); *H01L 2224/02185* (2013.01); *H01L 2224/02315* (2013.01); *H01L 2224/02331* (2013.01); *H01L 2224/13024* (2013.01); *H01L 2924/3512* (2013.01); *H01L 2924/35121* (2013.01)

(58) Field of Classification Search
CPC ..................... H01L 24/02; H01L 24/13; H01L 2224/02165; H01L 2224/02185; H01L 2224/02331; H01L 2224/02315; H01L 2224/13024; H01L 2224/0219
See application file for complete search history.

(56) References Cited

U.S. PATENT DOCUMENTS

| | | | |
|---|---|---|---|
| 6,277,669 B1 | 8/2001 | Kung et al. | |
| 6,940,177 B2 | 9/2005 | Dent et al. | |
| 7,932,615 B2 | 4/2011 | Rinne | |
| 8,058,735 B2 | 11/2011 | Lee et al. | |
| 8,405,211 B2 | 3/2013 | Tsai et al. | |
| 2004/0238941 A1* | 12/2004 | Satoh | H01L 23/49816 257/698 |
| 2008/0121943 A1* | 5/2008 | Lin | H01L 21/768 257/211 |
| 2009/0224391 A1* | 9/2009 | Lin | H01L 21/6835 257/690 |
| 2009/0309212 A1* | 12/2009 | Shim | H01L 21/568 257/700 |
| 2011/0316168 A1* | 12/2011 | Moon | H01L 23/481 257/774 |
| 2014/0057369 A1* | 2/2014 | Lee | H01L 21/4846 438/3 |
| 2014/0131858 A1* | 5/2014 | Pan | H01L 24/13 257/774 |
| 2014/0264930 A1* | 9/2014 | Yu | H01L 24/19 257/774 |

(Continued)

*Primary Examiner* — A. Sefer

(74) *Attorney, Agent, or Firm* — Muncy, Geissler, Olds & Lowe, P.C.

(57) ABSTRACT

A chip package includes a first substrate; a first insulation layer disposed over the first substrate; a conductive structure disposed within the first insulation layer; a buffering member embedded into the first insulation layer; a redistribution layer (RDL) electrically connected with the conductive structure and disposed over the conductive structure and the buffering member; and a second insulation layer disposed over the RDL, wherein a portion of the RDL is exposed from the second insulation layer and disposed over the buffering member.

16 Claims, 9 Drawing Sheets

(56) References Cited

U.S. PATENT DOCUMENTS

| | | | |
|---|---|---|---|
| 2015/0076698 A1* | 3/2015 | Lin | H01L 24/05 257/753 |
| 2015/0115462 A1* | 4/2015 | Lin | H01L 23/481 257/774 |
| 2015/0145108 A1* | 5/2015 | Yap | H01L 21/768 257/664 |

* cited by examiner

CHIP PACKAGE AND A MANUFACTURING METHOD THEREOF

TECHNICAL FIELD

The present invention relates to a chip package including a buffering member disposed adjacent to a redistribution layer (RDL) and configured for force absorption.

DISCUSSION OF THE BACKGROUND

Semiconductor devices are essential for many modern applications. With the advancement of electronic technology, semiconductor devices are becoming increasingly smaller in size while having greater functionality and greater amounts of integrated circuitry. Due to the miniaturized scale of semiconductor devices, wafer level chip scale packaging (WLCSP) is widely used for manufacturing. Numerous manufacturing steps are implemented within such small semiconductor devices.

However, the manufacturing of semiconductor devices in a miniaturized scale is becoming more complicated. An increase in the complexity of manufacturing semiconductor devices may cause deficiencies such as poor electrical interconnection, development of cracks or delamination of components. As such, there are many challenges for modifying the structure and manufacturing of semiconductor devices.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a chip package including a first substrate; a first insulation layer disposed over the first substrate; a conductive structure disposed within the first insulation layer; a buffering member embedded into the first insulation layer; a redistribution layer (RDL) electrically connected with the conductive structure and disposed over the conductive structure and the buffering member; and a second insulation layer disposed over the RDL, wherein a portion of the RDL is exposed from the second insulation layer and disposed over the buffering member.

In some embodiments, the buffering member is in contact with the RDL.

In some embodiments, the portion of the RDL exposed from the second insulation layer is partially disposed over or aligned with the buffering member.

In some embodiments, the buffering member is surrounded by the first insulation layer or is partially exposed from the first insulation layer.

In some embodiments, a width of the buffering member is substantially equal to a width of the portion of the RDL exposed from the second insulation layer.

In some embodiments, a thickness of the buffering member is about 0.05 µm to about 5 µm.

In some embodiments, the buffering member is insulative.

In some embodiments, the buffering member includes elastic, flexible or soft material.

In some embodiments, the buffering member includes elastomer, silicone, resin, epoxy, polymer, polyimide or polybenzoxazole (PBO).

In some embodiments, a connector is disposed over and electrically connected with the portion of the RDL exposed from the second insulation layer.

In some embodiments, the connector is at least partially surrounded by the second insulation layer.

In some embodiments, the connector is a conductive wire, a conductive bump, a conductive pillar or a soldering member.

In some embodiments, the chip package further includes a second substrate which includes a bond pad disposed over the second substrate and electrically connected with the RDL.

In some embodiments, the portion of the RDL exposed from the second insulation layer and the bond pad are bonded by a connector.

In some embodiments, the conductive structure is a via extending towards the first substrate or a pad disposed over and embedded into the first insulation layer.

In some embodiments, the first insulation layer and the second insulation layer include dielectric material.

Another aspect of the present disclosure provides a method of manufacturing a chip package including providing a substrate; disposing a first insulation layer over the substrate; forming a conductive structure within the first insulation layer; disposing a first patterned mask over the first insulation layer; removing a portion of the first insulation layer exposed from the patterned mask to form a recess; removing the first patterned mask; disposing a buffering member into the recess; forming a redistribution layer (RDL) over the conductive structure and the buffering member; disposing a second insulation layer over the RDL; disposing a second patterned mask over the second insulation layer; removing a portion of the second insulation layer to expose a portion of the RDL; and removing the second patterned mask.

In some embodiments, the buffering member is disposed by stencil squeezing.

In some embodiments, the recess is formed by photolithography and etching.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
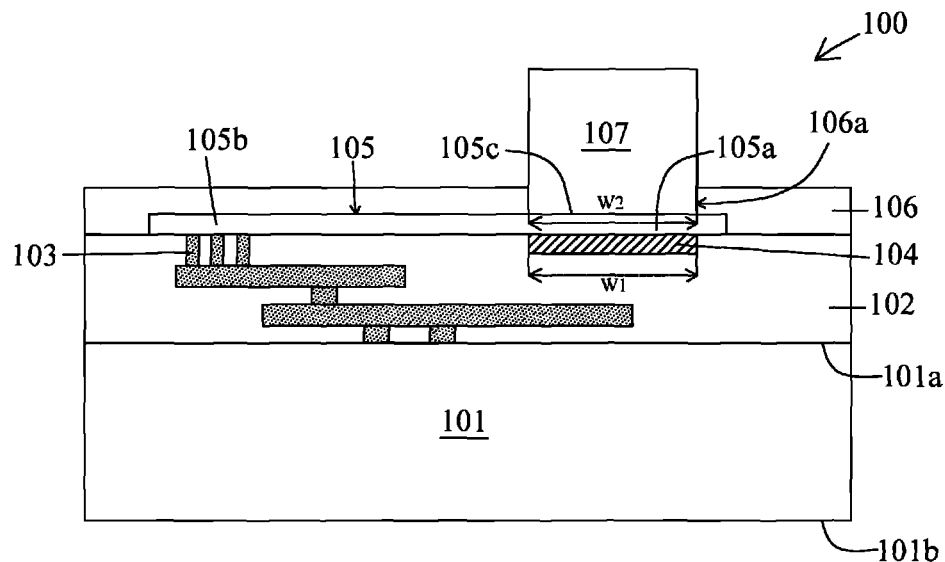
FIG. 1 is a schematic cross-sectional view of a chip package in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a chip package including a buffering member disposed adjacent to a redistribution layer (RDL) and configured for force absorption. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

A chip package is electrically connected with an external circuitry through an interconnect structure such as wire bonding, conductive wires, conductive pillars, conductive bumps or the like. A bond pad of the chip package is exposed, and the interconnect structure is disposed on the bond pad to electrically connect the chip package with the external circuitry. Upon disposing the interconnect structure, a stress or a force would be acted on the bond pad or the chip package. For example, during the wire bonding operation, a wire bond capillary head would exert a force on the bond pad to form and dispose a stud on the bond pad. Further, a movement of the wire bond capillary head during the wire bonding operation may generate a force on the bond pad or the chip package. The force acted on the bond pad or the chip package may cause damage on the bond pad as well as other components of the chip package. The force may even propagate towards an interior of the chip package. Cracks may develop within the bond pad or other components, and delamination of components may occur.

In the present disclosure, a chip package is disclosed. The chip package includes a buffering member disposed adjacent to a RDL. The buffering member can absorb a force, such as a pressing force on the RDL during formation of a wire bond stud on the RDL, a vibrational force generated by a wire bonding machine, or other kinds of forces acted upon the chip package during manufacturing. The buffering member can absorb those forces and relieve the stress during the manufacturing, and those forces would not propagate into an interior of the chip package. As such, damage on the chip package can be minimized or prevented.

FIG. 1 is a cross-sectional view of a chip package 100 in accordance with some embodiments of the present disclosure. In some embodiments, the chip package 100 includes a first substrate 101, a first insulation layer 102, a conductive structure 103, a buffering member 104, a redistribution layer (RDL) 105, a second insulation layer 106 and a connector 107. In some embodiments, the chip package 100 is a semiconductor package. In some embodiments, the chip package 100 is a die or a chip.

In some embodiments, the first substrate 101 is fabricated with a predetermined functional circuit thereon. In some embodiments, the first substrate 101 includes several conductive lines and several electrical components, such as transistors and diodes, connected by the conductive lines. In some embodiments, the first substrate 101 is a semiconductive substrate. In some embodiments, the first substrate 101 is an interposer or a wafer. In some embodiments, the first substrate 101 is a silicon substrate. In some embodiments, the first substrate 101 includes semiconductive material such as silicon, germanium, gallium, arsenic, and combinations thereof. In some embodiments, the first substrate 101 includes material such as ceramic, glass or the like. In some embodiments, the first substrate 101 is a glass substrate. In some embodiments, the first substrate 101 is in a quadrilateral, rectangular, square, polygonal or any other suitable shapes.

In some embodiments, the first substrate 101 includes a first surface 101*a* and a second surface 101*b* opposite to the first surface 101*b*. In some embodiments, the first surface 101*a* is a front side or an active side where the circuits or electrical components are disposed thereon. In some embodiments, the second surface 101*b* is a back side or an inactive side.

In some embodiments, the first insulation layer 102 is disposed over the first substrate 101. In some embodiments, the first insulation layer 102 is disposed over the first surface 101*a* of the first substrate 101. In some embodiments, the first insulation layer 102 includes several layers of dielectric material stacking over each other. In some embodiments, the first insulation layer 102 includes dielectric material such as silicon oxide, silicon nitride, silicon carbide, silicon oxynitride or the like.

In some embodiments, the conductive structure 103 is disposed within or surrounded by the first insulation layer 102. In some embodiments, the conductive structure 103 is configured to electrically connect a circuitry of the first substrate 101 with a circuitry external to the first substrate 101. In some embodiments, the conductive structure 103 is extended towards the first substrate 101. In some embodiments, the conductive structure 103 is extended horizontally or extended along a direction of the first surface 101a of the first substrate 101. In some embodiments, the conductive structure 103 includes several layers of conductive material disposed over each other. In some embodiments, the conductive structure 103 is a conductive line or conductive trace extending along the direction of the first surface 101a. In some embodiments, the conductive structure 103 is a via extending through a portion of the first insulation layer 102 towards the first substrate 101. In some embodiments, the via is partially exposed from the first insulation layer 102. In some embodiments, the conductive structure 103 is a pad disposed over and partially embedded into the first insulation layer 102. In some embodiments, the pad is partially exposed from the first insulation layer 102. In some embodiments, the conductive structure 103 includes conductive material or metallic material. In some embodiments, the conductive structure 103 includes gold, silver, copper, nickel, tungsten, aluminum, titanium, palladium and/or alloys thereof.

In some embodiments, the buffering member 104 is disposed over and partially embedded into the first insulation layer 102. In some embodiments, the buffering member 104 is extended horizontally over the first insulation layer 102. In some embodiments, the buffering member 104 is extended along the direction of the first surface 101a. In some embodiments, the buffering member 104 is surrounded by the first insulation layer 102. In some embodiments, the buffering member 104 is partially exposed from the first insulation layer 102. In some embodiments, the buffering member 104 is disposed over the conductive structure 103 or a portion of the conductive structure 103. In some embodiments, there is an interface between the buffering member 104 and the first insulation layer 102.

Figure 3:
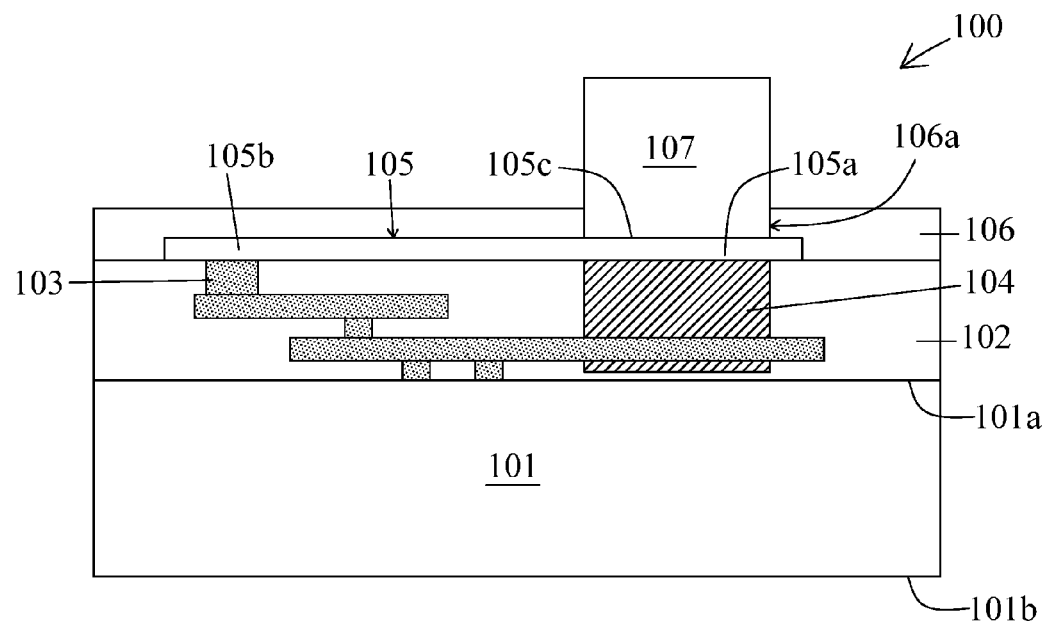
FIG. 3 is a schematic cross-sectional view of a chip package in accordance with some embodiments of the present disclosure.

In some embodiments as shown in FIG. 3, the buffering member 104 surrounds a portion of the conductive structure 103. In some embodiments, the buffering member 104 interfaces with a top surface and a bottom surface of the conductive structure 103.

In some embodiments, the buffering member 104 is configured to absorb a force or a stress applied thereon. In some embodiments, the buffering member 104 includes elastic, flexible or soft material. In some embodiments, the buffering member 104 includes elastomer, silicone, resin, epoxy, polymer polyimide or polybenzoxazole (PBO). In some embodiments, the buffering member 104 is insulative. In some embodiments, the buffering member 104 includes dielectric material. In some embodiments, a cross section of the buffering member 104 along the direction of the first surface 101a is in a rectangular, quadrilateral or square shape. In some embodiments, the buffering member 104 has a thickness of about 0.05 µm to about 5 µm. In some embodiments, the buffering member 104 has a width W1 of about 0.1 µm to about 10 mm.

Figure 2:
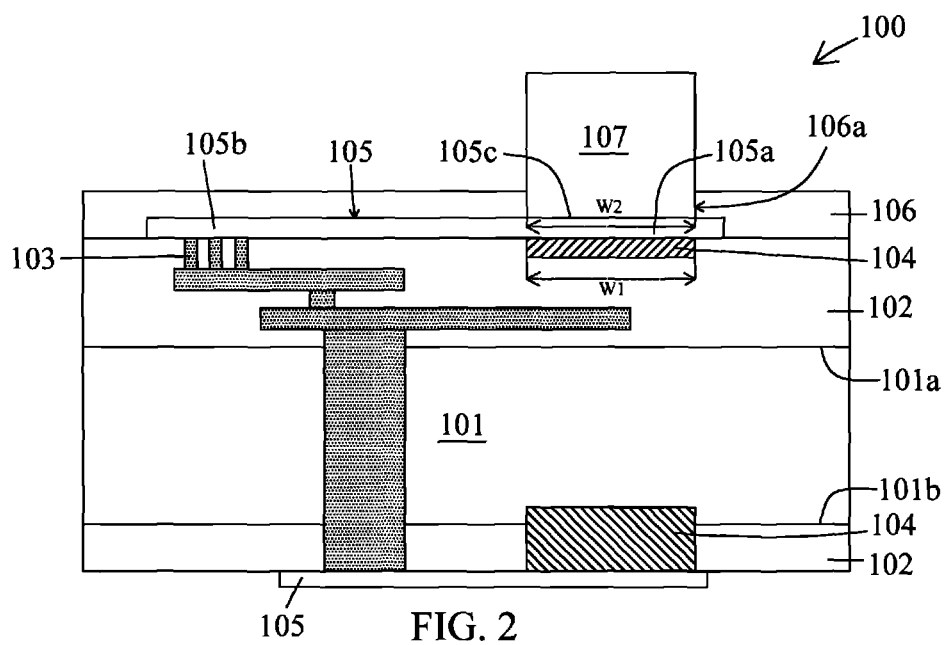
FIG. 2 is a schematic cross-sectional view of a chip package in accordance with some embodiments of the present disclosure.

In some embodiments, the RDL 105 is electrically connected with the conductive structure 103 and disposed over the first insulation layer 102, the conductive structure 103 and the buffering member 104. In some embodiments, the RDL 105 is electrically connected with the circuitry of the first substrate 101 through the conductive structure 103. In some embodiments, the RDL 105 is extended horizontally or along the direction of the first surface 101a. In some embodiments, the RDL 105 is in contact with the conductive structure 103 and the buffering member 104. In some embodiments as shown in FIG. 2, the first insulation layer 102 is disposed over the second surface 101b and the RDL 105 is disposed over the first insulation layer 102. In some embodiments, the buffering member 104 is disposed within the first insulation layer 102. In some embodiments, the buffering member 104 is extended or protruded into the substrate 101. In some embodiments, a seed layer is disposed between the RDL 105 and the first insulation layer 102. In some embodiments, the seed layer includes gold, silver, copper, nickel, tungsten, aluminum, titanium, palladium and/or alloys thereof.

Figure 4:
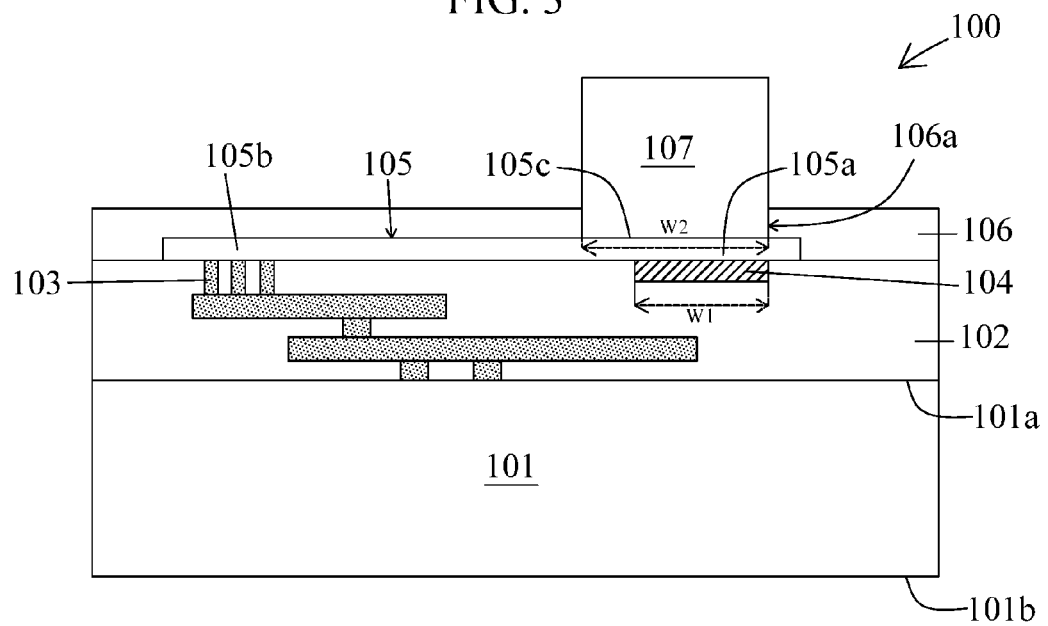
FIG. 4 is a schematic cross-sectional view of a chip package in accordance with some embodiments of the present disclosure.

Referring back to FIG. 1, in some embodiments, the RDL 105 includes a pad portion 105a and an elongated portion 105b. In some embodiments, the elongated portion 105b is disposed over and electrically connected with the conductive structure 103. In some embodiments, the conductive structure 103 is extended towards the elongated portion 105b. In some embodiments, the pad portion 105a is disposed over the buffering member 104. In some embodiments, the buffering member 104 is configured to absorb a force applied over the pad portion 105a of the RDL 105. In some embodiments, the width W1 of the buffering member 104 is substantially greater than or equal to a width W2 of the pad portion 105a of the RDL 105. In some embodiments, the width W2 of the pad portion 105a of the RDL 105 is a portion of the RDL 105 exposed from the second insulation layer 106. In some embodiments as shown in FIG. 4, the width W2 is substantially greater than the width W1.

In some embodiments, the second insulation layer 106 is disposed over the RDL 105. In some embodiments, the second insulation layer 106 is in contact with the first insulation layer 102 and the RDL 105. In some embodiments, the second insulation layer 106 includes several layers of dielectric material stacking over each other. In some embodiments, the second insulation layer 106 includes dielectric material such as silicon oxide, silicon nitride, silicon carbide, silicon oxynitride, polyimide-iso-indroquinazalinedione (PIQ) or the like. In some embodiments, the second insulation layer 106 includes the same material as or different material from the first insulation layer 102.

In some embodiments, a portion 105c of the RDL 105 is exposed from the second insulation layer 106 and partially disposed over the buffering member 104. In some embodiments, the second insulation layer 106 includes a recess 106a exposing the portion 105c of the RDL 105. In some embodiments, the recess 106a is partially disposed over or is aligned with the buffering member 104. In some embodiments, the portion 105c of the RDL 105 exposed from the second insulation layer 106 is partially aligned with the buffering member 104. In some embodiments, the portion 105c is partially disposed above or vertically aligned with the buffering member 104. In some embodiments, the portion 105c and the recess 106a are shifted from the buffering member 104, that the portion 105c and the recess 106a are not aligned with the buffering member 104. In some embodiments, the portion 105c exposed from the second insulation layer 106 is configured to receive a conductive member such as a conductive trace, a conductive pillar, a conductive bump or the like. In some embodiments, a cross section of the pad portion 105a along the direction of the first surface 101a is in a rectangular, quadrilateral or square shape. In some embodiments, the buffering member 104 is configured to absorb a force applied over the portion 105c of the RDL 105 exposed from the second insulation layer 106. In some embodiments, the width W1 of the buffering member 104 is substantially greater than or equal to the width W2 of the portion 105c exposed from the second insulation layer 106. In some embodiments, the width W1 and the width W2 may not be relevant to each other. For example, the width W1 can be smaller or greater than the width W2.

In some embodiments, the connector 107 is disposed over and electrically connected with the portion 105c of the RDL 105 exposed from the second insulation layer 106. In some embodiments, the connector 107 is bonded with the portion 105c. In some embodiments, the connector 107 is at least partially surrounded by the second insulation layer 106. In some embodiments, the connector 107 is electrically connected with the circuitry of the first substrate 101 through the conductive structure 103 and the RDL 105. In some embodiments, the connector 107 is partially disposed over or aligned with the buffering member 104. In some embodiments, the connector 107 is vertically aligned with the buffering member 104, the pad portion 105a or the portion 105c exposed from the second insulation layer 106. In some embodiments, the connector 107 is shifted from the buffering member 104, that the connector 107 is not aligned with the buffering member 104. In some embodiments, the buffering member 104 is configured to absorb a force on the pad portion 105a or the portion 105c when the connector 107 is disposed over the pad portion 105a or the portion 105c.

In some embodiments, the connector 107 includes conductive material or metallic material. In some embodiments, the connector 107 is a conductive wire, a conductive bump, a conductive pillar, a soldering member or the like. In some embodiments, the connector 107 is a wire bond stud or a portion of a bonding wire. In some embodiments, the connector 107 is a solder joint, a solder bump, a solder ball, a ball grid array (BGA) ball, a controlled collapse chip connection (C4) bump, a microbump or the like. In some embodiments, the connector 107 is a metallic pillar or post protruding from the portion 105c. In some embodiments, the connector 107 is in a linear, cylindrical, spherical or hemispherical shape. In some embodiments, the connector 107 includes gold, silver, copper, nickel, solder, tin, lead, tungsten, aluminum, titanium, palladium and/or alloys thereof.

Figure 5:
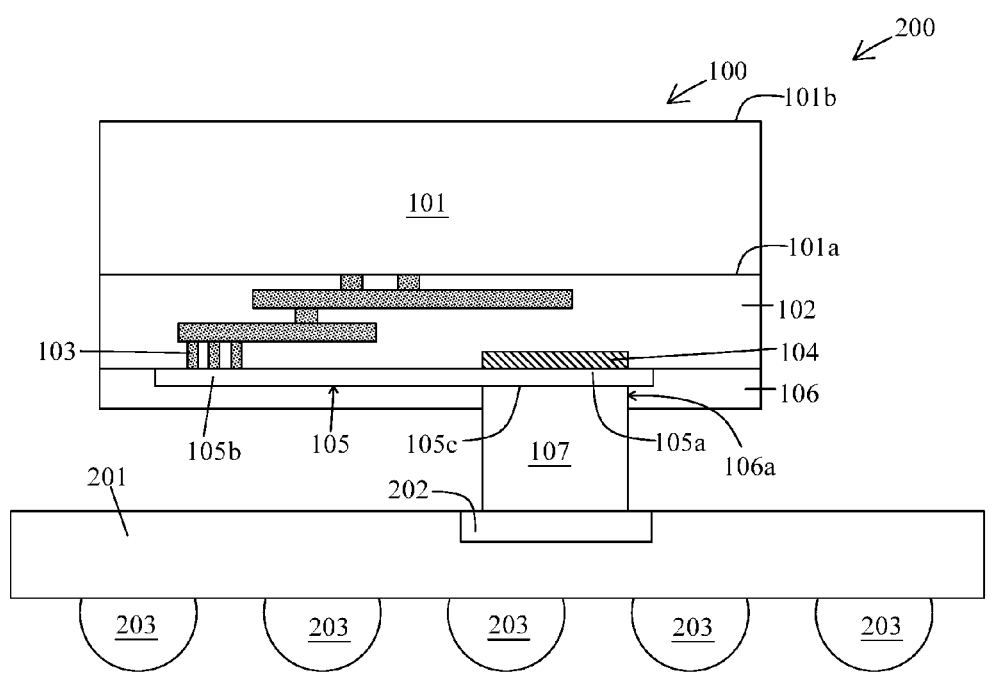
FIG. 5 is a schematic cross-sectional view of a package including the chip package of any one of FIGS. 1-4 in accordance with some embodiments of the present disclosure.

FIG. 5 is a cross-sectional view of a package 200 in accordance with some embodiments of the present disclosure. In some embodiments, the package 200 includes the chip package 100 and a second substrate 201. In some embodiments, the chip package 100 of any one of FIGS. 1-4 is flipped and disposed over the second substrate 201. In some embodiments, the chip package 100 is bonded with the second substrate 201 to become the package 200. In some embodiments, the chip package 100 is a flip chip.

In some embodiments, the second substrate 201 is disposed opposite to the second insulation layer 106. In some embodiments, the second substrate 201 is a packaging substrate. In some embodiments, the second substrate 201 includes several conductive lines and several electrical components, such as transistors and diodes, connected by the conductive lines. In some embodiments, the second substrate 201 is a semiconductive substrate. In some embodiments, the second substrate 201 is an interposer or a wafer. In some embodiments, the second substrate 201 is a silicon substrate. In some embodiments, the second substrate 201 includes semiconductive material such as silicon, germanium, gallium, arsenic, and combinations thereof. In some embodiments, the second substrate 201 includes material such as ceramic, glass or the like. In some embodiments, the second substrate 201 is a glass substrate. In some embodiments, the second substrate 201 is in a quadrilateral, rectangular, square, polygonal or any other suitable shapes.

In some embodiments, the second substrate 201 includes a bond pad 202 disposed over or within the second substrate 201. In some embodiments, the bond pad 202 is disposed over a surface of the second substrate 201. In some embodiments, the bond pad 202 includes conductive material such as copper, silver, nickel, aluminum, gold, titanium, tungsten or the like. In some embodiments, the bond pad 202 is configured to receive a conductive member such as a conductive trace, a conductive pillar, a conductive bump or the like.

In some embodiments, the connector 107 is disposed over and bonded with the bond pad 202. In some embodiments, the portion 105c of the RDL 105 exposed from the second insulation layer 106 and the bond pad 202 are bonded by the connector 107. In some embodiments, the circuitry of the first substrate 101 is electrically connected with a circuitry of the second substrate 201 through the conductive structure 103, the RDL 105, the connector 107 and the bond pad 202. In some embodiments, the bond pad 202 is electrically connected with the RDL 105 through the connector 107. In some embodiments, a soldering material is disposed between the bond pad 202 and the connector 107.

In some embodiments, the first insulation layer 102 is disposed over the second surface 101b of the first substrate 101, and the RDL 105 is disposed over the first insulation layer 102. In some embodiments, the connector 107 is bonded with the second substrate 201 without flipping of the chip package 100.

In some embodiments, the second substrate 201 includes a conductive bump 203 disposed over the second substrate 201. In some embodiments, the conductive bump 203 is protruded from the second substrate 201. In some embodiments, the conductive bump 203 is configured to electrically connect with a circuitry external to the second substrate 201. In some embodiments, the conductive bump 203 is a solder joint, a solder bump, a solder ball, a ball grid array (BGA) ball, a controlled collapse chip connection (C4) bump, a microbump or the like. In some embodiments, the conductive bump 203 is in a spherical or hemispherical shape. In some embodiments, the conductive bump 203 includes conductive material such as solder, tin, lead, gold, silver, copper, nickel, tungsten, aluminum, titanium, palladium and/or alloys thereof.

Figure 6:
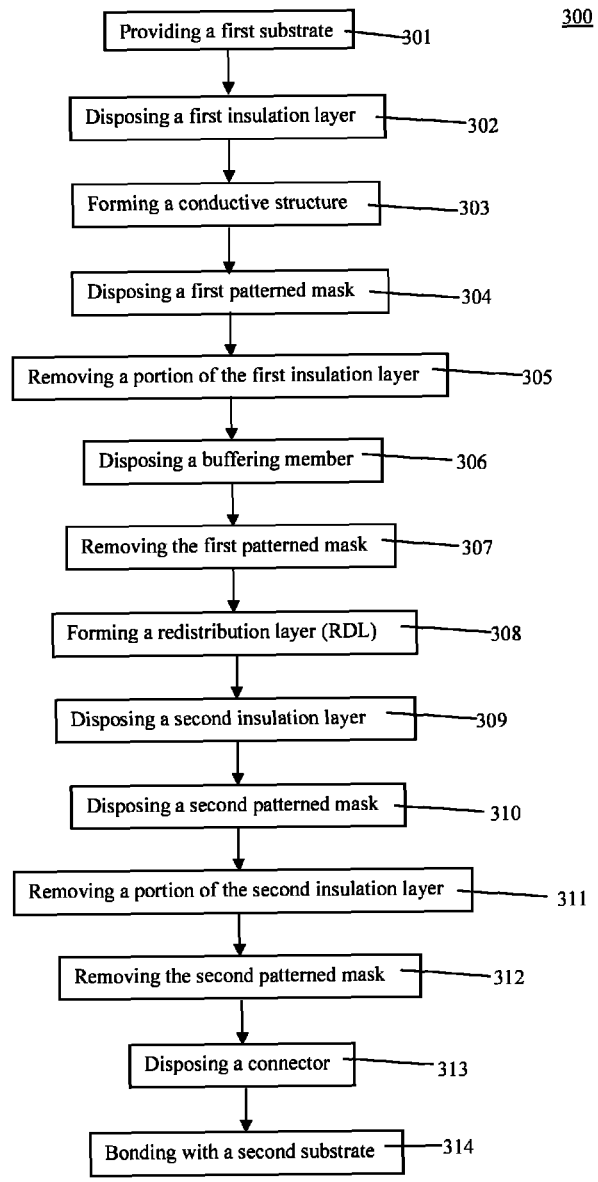
FIG. 6 is a flow chart of a method of manufacturing a chip package in accordance with some embodiments of the present disclosure.

In the present disclosure, a method of manufacturing a chip package (100 or 200) is also disclosed. In some embodiments, the chip package (100 or 200) can be formed by a method 300 of FIG. 6. The method 300 includes a number of operations and the description and illustration are not deemed as a limitation as the sequence of the operations. The method 300 includes a number of steps (301, 302, 303, 304, 305, 306, 307, 308, 309, 310, 311, 312, 313 and 314).

Figure 7:
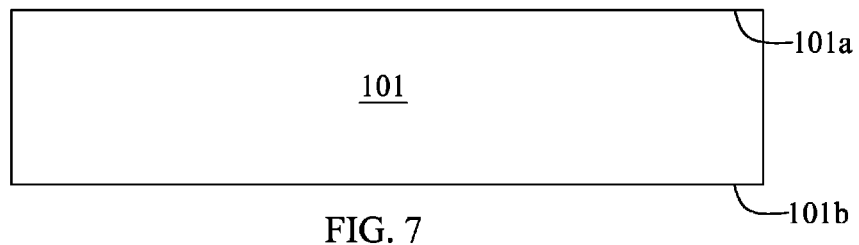
FIGS. 7-20 are schematic views of manufacturing the chip package by the method of FIG. 6 in accordance with some embodiments of the present disclosure.

In step 301, a first substrate 101 is provided or received as shown in FIG. 7. In some embodiments, the first substrate 101 includes a first surface 101a and a second surface 101b opposite to the first surface 101a. In some embodiments, the first substrate 101 includes several conductive lines and several electrical components, such as transistors and diodes, connected by the conductive lines. In some embodiments, the first substrate 101 is a semiconductive substrate. In some embodiments, the first substrate 101 is a silicon substrate. In some embodiments, the first substrate 101 includes semiconductive material such as silicon, germanium, gallium, arsenic, and combinations thereof. In some embodiments, the first substrate 101 is in a quadrilateral, rectangular, square, polygonal or any other suitable shapes. In some embodiments, the first substrate 101 has a similar configuration as described above or illustrated in any one of FIGS. 1-4.

Figure 8:
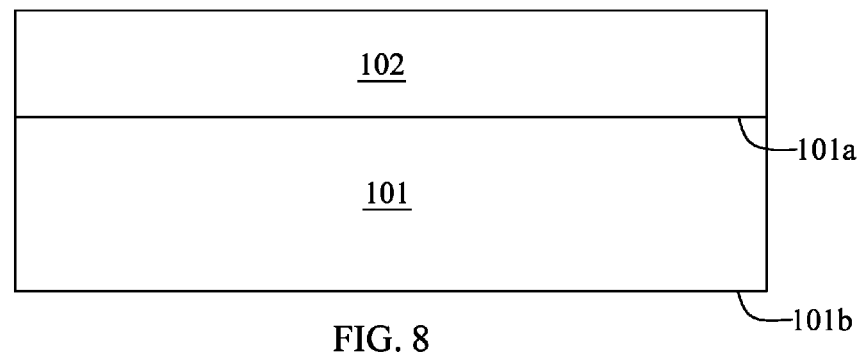

In step 302, a first insulation layer 102 is disposed over the first substrate 101 as shown in FIG. 8. In some embodiments, the first insulation layer 102 is disposed by chemical vapor deposition (CVD), plasma-enhanced chemical vapor deposition (PECVD), spin coating or any other suitable processes. In some embodiments, the first insulation layer 102 is disposed over the first surface 101a of the first substrate 101. In some embodiments, the first insulation layer 102 is disposed over the second surface 101b of the first substrate 101. In some embodiments, the first insulation layer 102 includes several layers of dielectric material stacking over each other. In some embodiments, the first insulation layer 102 includes dielectric material such as silicon oxide, silicon nitride, silicon carbide, silicon oxynitride or the like. In some embodiments, the first insulation layer 102 has a similar configuration as described above or illustrated in any one of FIGS. 1-4.

Figure 9:
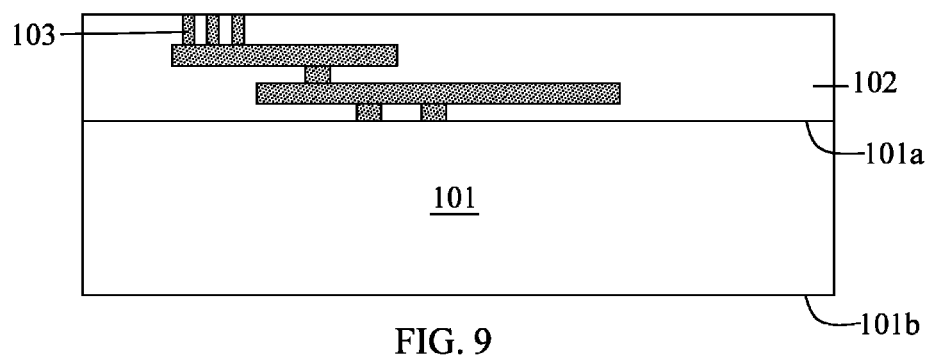

In step 303, a conductive structure 103 is formed as shown in FIG. 9. In some embodiments, the conductive structure 103 is formed within the first insulation layer 102. In some embodiments, the conductive structure 103 is formed by disposing a mask over the first insulation layer 102, removing a portion of the first insulation layer 102, and disposing a conductive material into the removed portion of the first insulation layer 102 to form the conductive structure 103 within the first insulation layer 102. In some embodiments, the removal of the first insulation layer 102 is implemented by photolithography and etching or any other suitable processes. In some embodiments, the conductive material is disposed by electroplating or any other suitable processes.

In some embodiments, the conductive structure 103 is configured to electrically connect a circuitry of the first substrate 101 with a circuitry external to the first substrate 101. In some embodiments, the conductive structure 103 is a via extending through a portion of the first insulation layer 102 towards the first substrate 101. In some embodiments, the via is partially exposed from the first insulation layer 102. In some embodiments, the conductive structure 103 is a pad disposed over and partially embedded into the first insulation layer 102. In some embodiments, the pad is partially exposed from the first insulation layer 102. In some embodiments, the conductive structure 103 includes gold, silver, copper, nickel, tungsten, aluminum, titanium, palladium and/or alloys thereof. In some embodiments, the conductive structure 103 has a similar configuration as described above or illustrated in any one of FIGS. 1-4.

Figure 10:
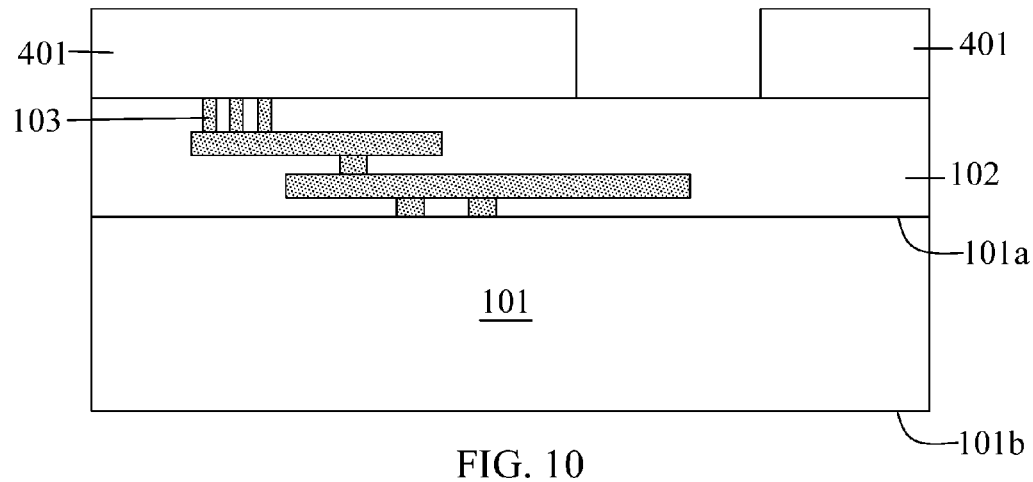

In step 304, a first patterned mask 401 is disposed over the first insulation layer 102 as shown in FIG. 10. In some embodiments, the first patterned mask 401 is formed by disposing a photoresist (PR) over the first insulation layer 102 by deposition or any other suitable processes, and removing a portion of the PR by photolithography and etching or any other suitable processes, such that a portion of the first insulation layer 102 is exposed from the first patterned mask 401.

Figure 11:
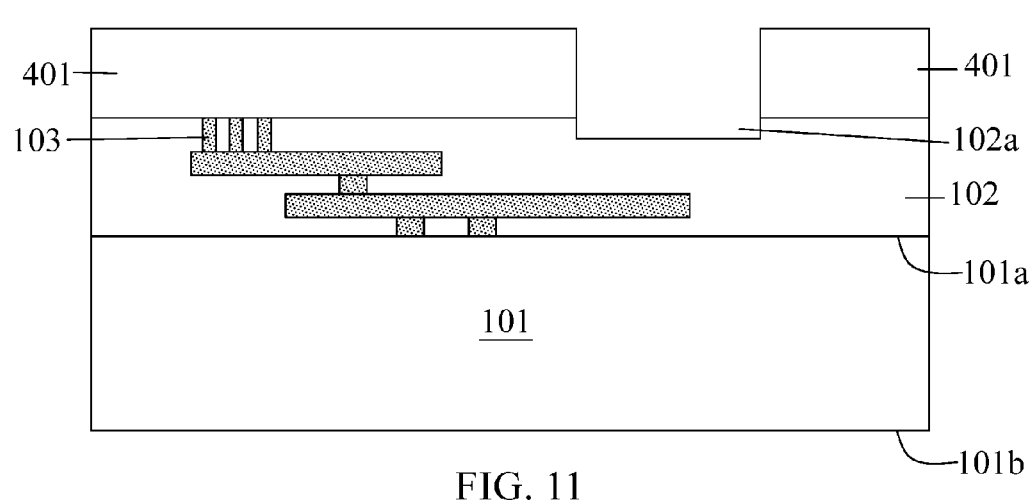

In step 305, a portion of the first insulation layer 102 exposed from the first patterned mask 401 is removed to form a first recess 102a as shown in FIG. 11. In some embodiments, the portion of the first insulation layer 102 exposed from the first patterned mask 401 is removed by etching or any other suitable processes. In some embodiments, the first insulation layer 102 without covering of the first patterned mask 401 is removed. In some embodiments, the first recess 102a is extended towards the first substrate 101.

Figure 12:
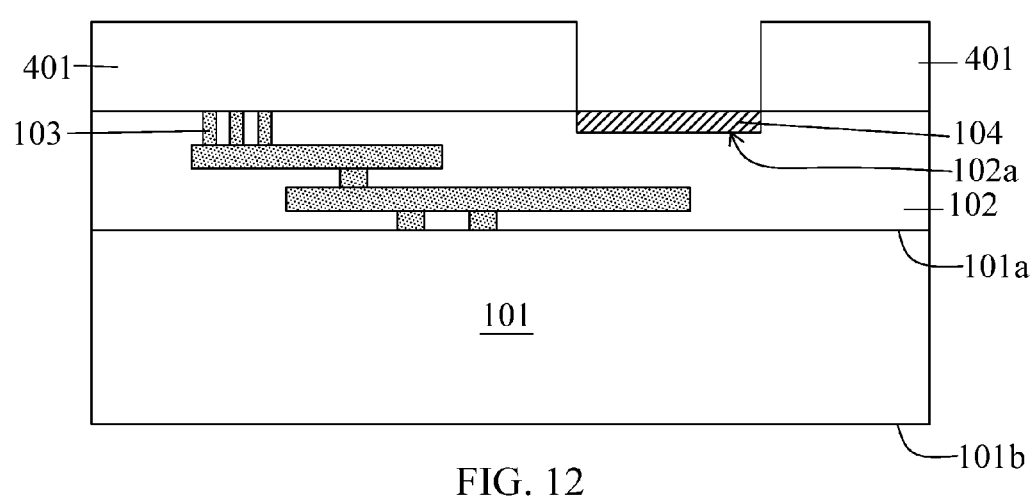

In step 306, a buffering member 104 is disposed into the recess 102a as shown in FIG. 12. In some embodiments, an elastic or soft material, such as elastomer, is disposed within the recess 102a by stencil squeezing or any other suitable processes to form the buffering member 104. In some embodiments, the buffering member 104 fills the recess 102a and is partially exposed from the first insulation layer 102. In some embodiments, the buffering member 104 is disposed over the conductive structure 103. In some embodiments, the recess 102a is extended towards the conductive structure 103, such that the buffering member 104 is contacted with or surrounds the conductive structure 103. In some embodiments, the buffering member 104 contacts with or surrounds one or more layers of the conductive structure 103. In some embodiments, the buffering member 104 has a similar configuration as described above or illustrated in any one of FIGS. 1-4.

Figure 13:
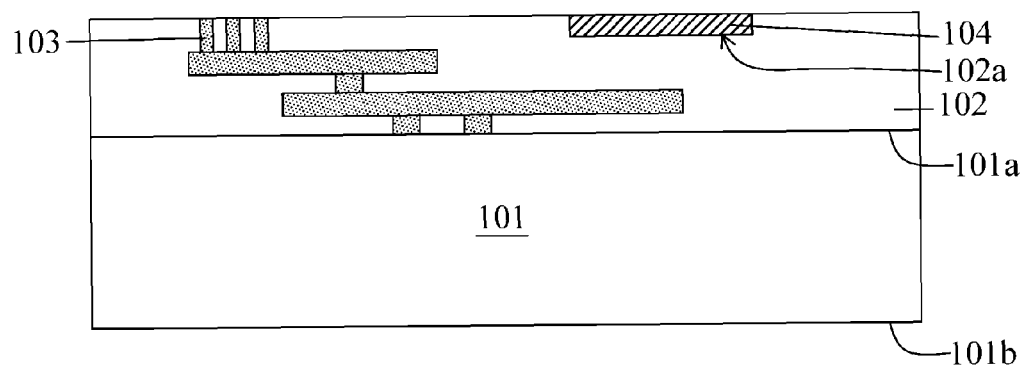

In step 307, the first patterned mask 401 is removed as shown in FIG. 13. In some embodiments, the first patterned mask 401 is removed by etching, stripping or any other suitable processes.

In some embodiments, the conductive structure 103 is formed after the formation of the buffering member 104 (the step 304-306) and the removal of the first patterned mask 401 (the step 307). In some embodiments, the conductive structure 103, such as a via or a pad, is formed after the step 307, so that the step 303 is implemented after the step 307. In some embodiments, the conductive structure 103 is at least partially exposed from the first insulation layer 102 after the formation of the buffering member 104 (the step 304-306) and the removal of the first patterned mask 401 (the step 307).

Figure 14:
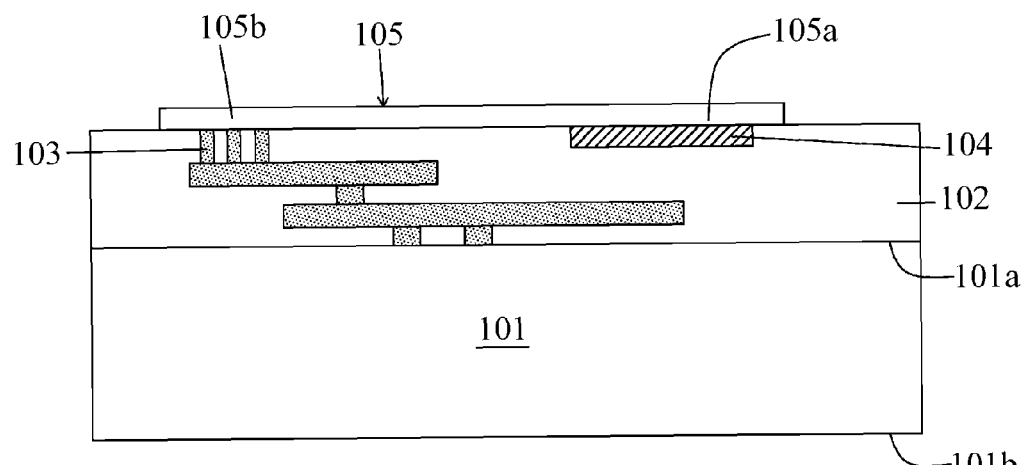

In step 308, an RDL 105 is formed as shown in FIG. 14. In some embodiments, the RDL is formed over the first insulation layer 102, the conductive structure 103 and the buffering member 104. In some embodiments, the RDL 105 is formed by photolithography and electroplating. In some embodiments, the RDL 105 is formed by disposing a mask over the first insulation layer 102 and disposing a conductive material by electroplating or any other suitable processes. In some embodiments, a seed layer is disposed over the first insulation layer 102 and then the conductive material is disposed over the seed layer. In some embodiments, the RDL 105 is in contact with the conductive structure 103 and the buffering member 104. In some embodiments, the RDL 105 includes a pad portion 105a disposed over the buffering member 104 and an elongated portion 105b disposed over the conductive structure 103. In some embodiments, the RDL 105 includes gold, silver, copper, nickel, tungsten, aluminum, titanium, palladium and/or alloys thereof. In some embodiments, the RDL 105 has a similar configuration as described above or illustrated in any one of FIGS. 1-4.

Figure 15:
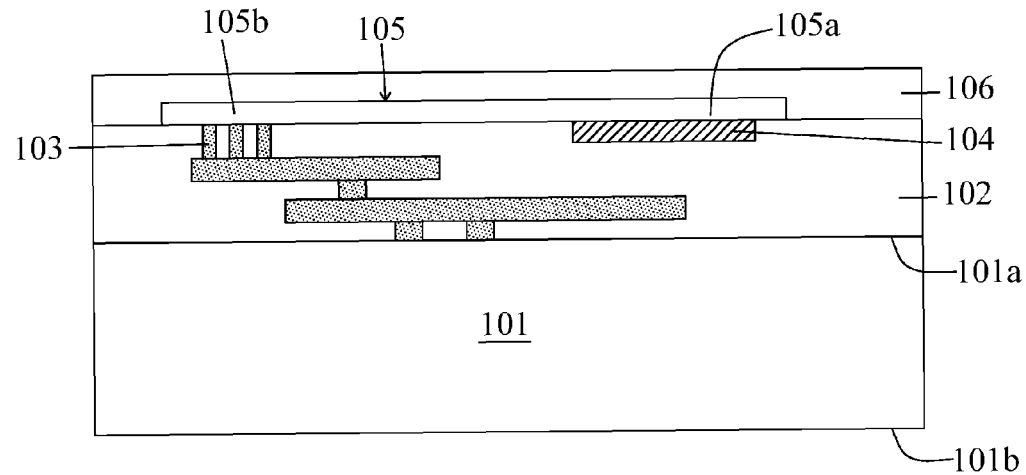

In step 309, a second insulation layer 106 is disposed over the RDL 105 as shown in FIG. 15. In some embodiments, the second insulation layer 106 is disposed by CVD, PECVD, spin coating or any other suitable processes. In some embodiments, the second insulation layer 106 is disposed over the RDL 105 and the first insulation layer 102. In some embodiments, the second insulation layer 106 includes several layers of dielectric material stacking over each other. In some embodiments, the second insulation layer 106 includes dielectric material such as silicon oxide, silicon nitride, silicon carbide, silicon oxynitride, PIQ or the like. In some embodiments, the second insulation layer 106 has a similar configuration as described above or illustrated in any one of FIGS. 1-4.

Figure 16:
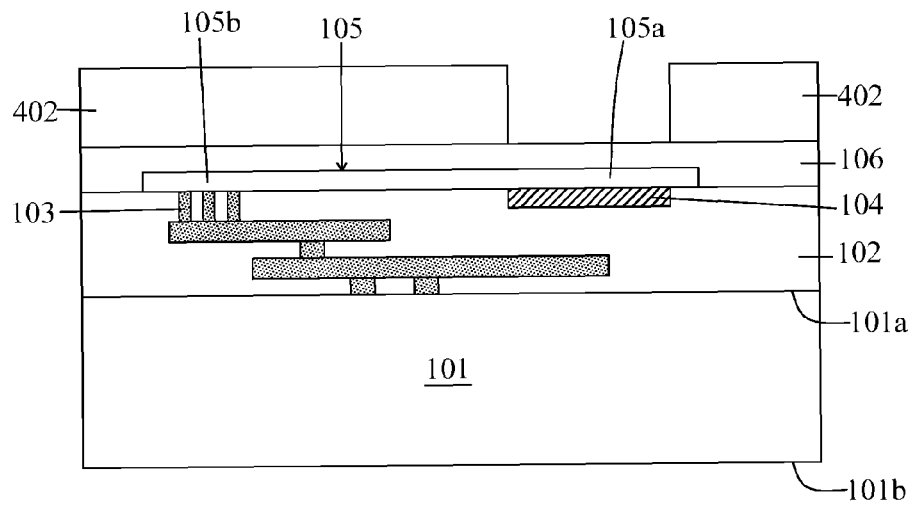

In step 310, a second patterned mask 402 is disposed over the second insulation layer 106 as shown in FIG. 16. In some embodiments, the second patterned mask 402 is formed by disposing a photoresist (PR) over the second insulation layer

106 by deposition or any other suitable processes, and removing a portion of the PR by photolithography and etching or any other suitable processes, such that a portion of the second insulation layer 106 is exposed from the second patterned mask 402.

Figure 17:
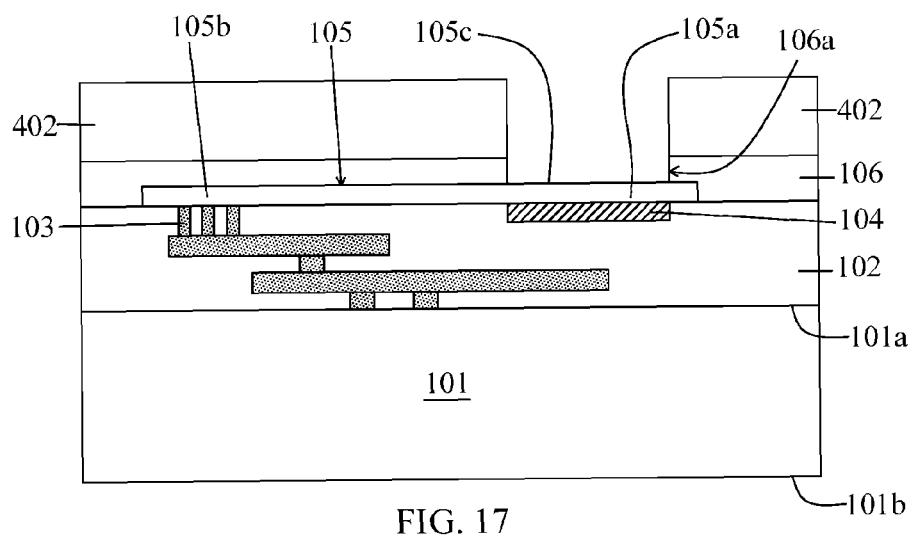

In step 311, a portion of the second insulation layer 106 exposed from the second patterned mask 402 is removed to form a second recess 106a as shown in FIG. 17. In some embodiments, the portion of the second insulation layer 106 exposed from the second patterned mask 402 is removed by etching or any other suitable processes. In some embodiments, the second insulation layer 106 without covering of the second patterned mask 402 is removed. In some embodiments, the second recess 106a is extended towards the first substrate 101. In some embodiments, a portion 105c of the RDL 105 is exposed from the second insulation layer 106 after the removal of the portion of the second insulation layer 106. In some embodiments, the pad portion 105a of the RDL 105 is exposed from the second insulation layer 106. In some embodiments, the portion 105c of the RDL exposed from the second insulation layer 106 is partially disposed above or aligned with the buffering member 104. In some embodiments, the second recess 106a is partially disposed above or aligned with the buffering member 104.

Figure 18:
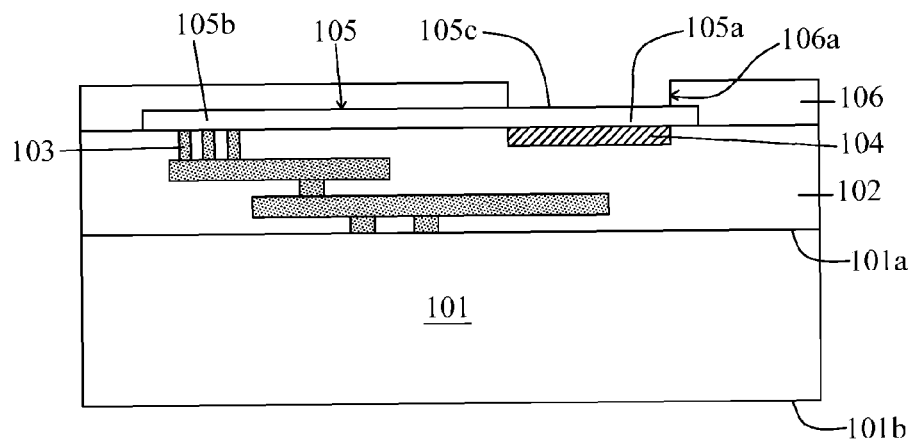

In step 312, the second patterned mask 402 is removed as shown in FIG. 18. In some embodiments, the second patterned mask 402 is removed by etching, stripping or any other suitable processes.

Figure 19:
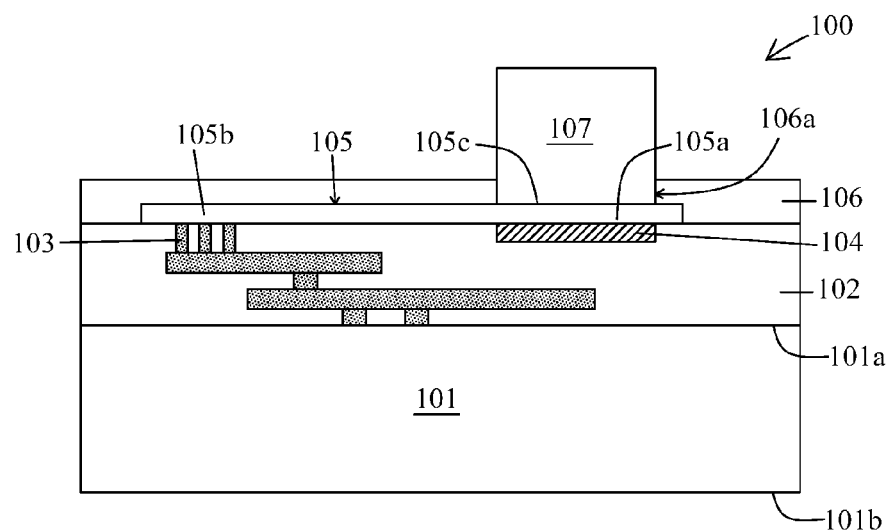

In step 313, a connector 107 is disposed over the pad portion 105a or the portion 105c of the RDL 105 as shown in FIG. 19. In some embodiments, the connector 107 is disposed within the second recess 106a. In some embodiments, the connector 107 is at least partially surrounded by the second insulation layer 106. In some embodiments, the connector 107 is partially disposed over or is aligned with the buffering member 104. In some embodiments, the connector 107 is vertically aligned with the buffering member 104, the pad portion 105a or the portion 105c exposed from the second insulation layer 106. In some embodiments, the connector 107 includes conductive material. In some embodiments, the connector 107 is a conductive wire, a conductive bump, a conductive pillar, a soldering member or the like. In some embodiments, the connector 107 includes gold, silver, copper, nickel, solder, tin, lead, tungsten, aluminum, titanium, palladium and/or alloys thereof. In some embodiments, the connector 107 has a similar configuration as described above or illustrated in any one of FIGS. 1-4. In some embodiments, a chip package 100 as shown in any one of FIGS. 1-4 is formed.

In some embodiments, the connector 107 is disposed by electroplating, stencil squeezing, wire bonding, ball dropping, solder pasting or any other suitable processes. In some embodiments, the buffering member 104 is configured to absorb a force generated during the disposing of the connector 107, such as vibrational force from a wire bonding machine, a pressing force on the pad portion 105a or the portion 105c from the wire bonding machine, a force on the pad portion 105a, the portion 105c during the disposing or formation of the connector 107. As such, the force exerted on the chip package 100, the pad portion 105a or the portion 105c during the step 313 can be absorbed by the buffering member 104. Such absorption can prevent damage of the components in the chip package 100 and prevent propagation of the force to an interior of the chip package 100.

Figure 20:
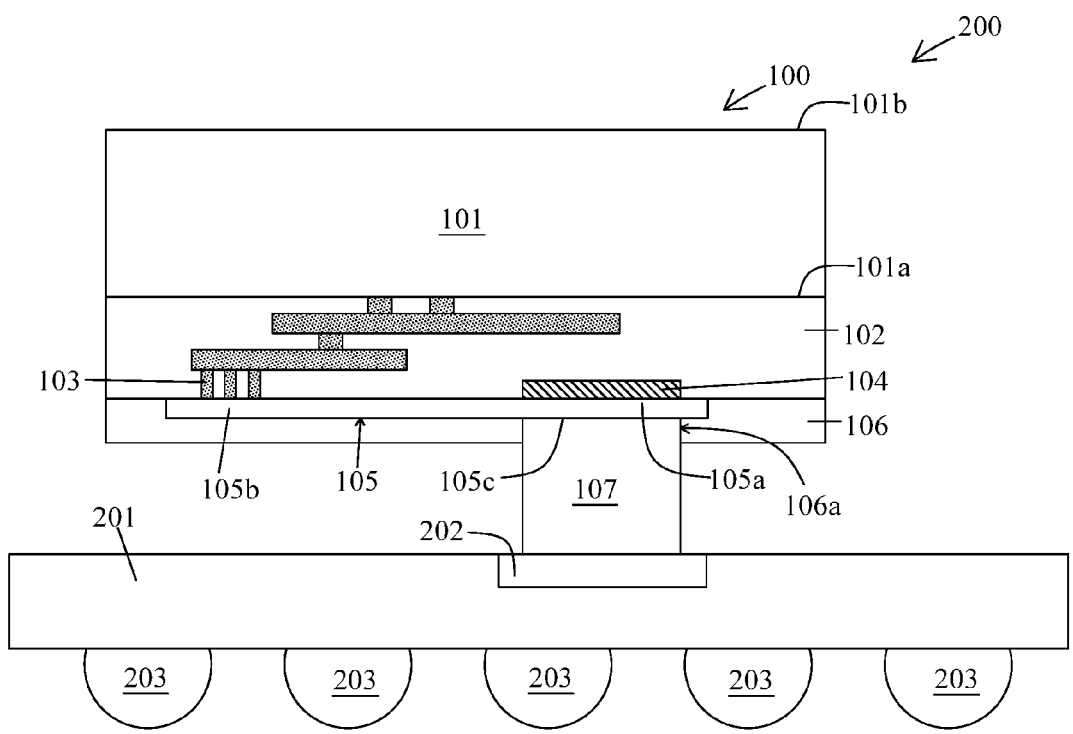

In step 314, the chip package 100 is bonded with a second substrate 201 to become a package 200 as shown in FIG. 20. In some embodiments, a second substrate 201 including a bond pad 202 is provided or received, and the second substrate 201 is bonded with the chip package 100. In some embodiments, the chip package 100 is flipped and then bonded with the second substrate 201 by the connector 107. In some embodiments, the connector 107 is disposed over and bonded with the bond pad 202, such that the circuitry of the chip package 100 is electrically connected with the second substrate 201. In some embodiments, the package 200 has a similar configuration as described above or illustrated in FIG. 5. In some embodiments, there is a stress over the chip package 100 upon or after bonding the chip package 100 with the second substrate 201 by the connector 107, and the buffering member 104 is configured to absorb or relieve the stress.

One aspect of the present disclosure provides a chip package including a first substrate; a first insulation layer disposed over the first substrate; a conductive structure disposed within the first insulation layer; a buffering member embedded into the first insulation layer; a redistribution layer (RDL) electrically connected with the conductive structure and disposed over the conductive structure and the buffering member; and a second insulation layer disposed over the RDL, wherein a portion of the RDL is exposed from the second insulation layer and disposed over the buffering member.

Another aspect of the present disclosure provides a method of manufacturing a chip package including providing a substrate; disposing a first insulation layer over the substrate; forming a conductive structure within the first insulation layer; disposing a first patterned mask over the first insulation layer; removing a portion of the first insulation layer exposed from the patterned mask to form a recess; removing the first patterned mask; disposing a buffering member into the recess; forming a redistribution layer (RDL) over the conductive structure and the buffering member; disposing a second insulation layer over the RDL; disposing a second patterned mask over the second insulation layer; removing a portion of the second insulation layer to expose a portion of the RDL; and removing the second patterned mask.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A chip package comprising:
a first substrate;
a first insulation layer disposed over the first substrate;

a conductive structure disposed within the first insulation layer;

a buffering member embedded into the first insulation layer;

a redistribution layer (RDL) electrically connected with the conductive structure and disposed over the conductive structure and the buffering member; and a second insulation layer disposed over the RDL, wherein a portion of the RDL is exposed from the second insulation layer and disposed over the buffering member, wherein a width of the buffering member is substantially equal to a width of the portion of the RDL exposed from the second insulation layer, wherein a thickness of the buffering member is about 0.05 μm to about 5 μm, and wherein the buffering member includes elastic, flexible or soft material.

2. The chip package of claim 1, wherein the buffering member is in contact with the RDL.

3. The chip package of claim 1, wherein the portion of the RDL exposed from the second insulation layer is partially disposed over or aligned with the buffering member.

4. The chip package of claim 1, wherein the buffering member is surrounded by the first insulation layer or is partially exposed from the first insulation layer.

5. The chip package of claim 1, wherein the buffering member is insulative.

6. The chip package of claim 1, wherein the buffering member includes elastomer, silicone, resin, epoxy, polymer, polyimide or polybenzoxazole (PBO).

7. The chip package of claim 1, wherein a connector is disposed over and electrically connected with the portion of the RDL exposed from the second insulation layer.

8. The chip package of claim 7, wherein the connector is at least partially surrounded by the second insulation layer.

9. The chip package of claim 7, wherein the connector is a conductive wire, a conductive bump, a conductive pillar or a soldering member.

10. The chip package of claim 1, further comprising a second substrate including a bond pad disposed over the second substrate and electrically connected with the RDL.

11. The chip package of claim 10, wherein the portion of the RDL exposed from the second insulation layer and the bond pad are bonded by a connector.

12. The chip package of claim 1, wherein the conductive structure is a via extending towards the first substrate or a pad disposed over and embedded into the first insulation layer.

13. The chip package of claim 1, wherein the first insulation layer and the second insulation layer include dielectric material.

14. A method of manufacturing a chip package, comprising:

providing a substrate;

disposing a first insulation layer over the substrate;

forming a conductive structure within the first insulation layer;

disposing a first patterned mask over the first insulation layer;

removing a portion of the first insulation layer exposed from the patterned mask to form a recess;

removing the first patterned mask;

disposing a buffering member into the recess;

forming a redistribution layer (RDL) over the conductive structure and the buffering member;

disposing a second insulation layer over the RDL;

disposing a second patterned mask over the second insulation layer;

removing a portion of the second insulation layer to expose a portion of the RDL; and removing the second patterned mask, wherein a width of the buffering member is substantially equal to a width of the portion of the RDL exposed from the second insulation layer, wherein a thickness of the buffering member is about 0.05 μm to about 5 μm, and wherein the buffering member includes elastic, flexible or soft material.

15. The method of claim 14, wherein the buffering member is disposed by stencil squeezing.

16. The method of claim 14, wherein the recess is formed by photolithography and etching.

* * * * *